(12) United States Patent
Feng

(10) Patent No.: US 10,817,093 B2
(45) Date of Patent: Oct. 27, 2020

(54) TOUCH DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Xiaoliang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 128 days.

(21) Appl. No.: 16/092,446

(22) PCT Filed: Jul. 7, 2018

(86) PCT No.: PCT/CN2018/099239
§ 371 (c)(1),
(2) Date: Oct. 10, 2018

(87) PCT Pub. No.: WO2019/223117
PCT Pub. Date: Nov. 28, 2019

(65) Prior Publication Data
US 2020/0125199 A1    Apr. 23, 2020

(30) Foreign Application Priority Data
May 24, 2018 (CN) .......................... 2018 1 0505239

(51) Int. Cl.
*G02F 1/1333* (2006.01)
*G02F 1/1335* (2006.01)
(Continued)

(52) U.S. Cl.
CPC ........ *G06F 3/0412* (2013.01); *G02F 1/13338* (2013.01); *G02F 1/133512* (2013.01);
(Continued)

(58) Field of Classification Search
CPC ......... G06F 3/0412; G06F 2203/04103; G06F 2203/04111; G06F 3/0443;
(Continued)

(56) References Cited

U.S. PATENT DOCUMENTS 10,234,998 B2    3/2019    Liu et al.
2011/0074729 A1    3/2011    Im et al.
(Continued)

FOREIGN PATENT DOCUMENTS

CN    202735635    2/2013
CN    103995612    8/2014
(Continued)

*Primary Examiner* — Abhishek Sarma

(57) ABSTRACT

A touch display panel and a manufacturing method thereof is provided. The manufacturing method includes, first, forming a touch layer on a substrate, and the touch layer comprising a light-shielding layer, a touch pattern layer, a bridge layer, a peripheral line, and a bonding pad; next, forming a color filter layer on the touch layer to form a touch color filter substrate, and the color filter layer comprising a black matrix, a color resist, and a protective layer; last, encapsulating the touch color filter substrate, a thin film transistor substrate, and a liquid crystal display layer or an organic light emitting (OLED) display layer.

10 Claims, 4 Drawing Sheets

(51) Int. Cl.
*G06F 3/041* (2006.01)
*H01L 27/32* (2006.01)

(52) U.S. Cl.
CPC ...... *G02F 1/133514* (2013.01); *H01L 27/323* (2013.01); *G02F 2001/133357* (2013.01); *G06F 2203/04103* (2013.01)

(58) Field of Classification Search
CPC ........... G02F 1/133514; G02F 1/13338; G02F 1/133512; G02F 2001/133357; G02F 1/1333; H01L 27/323; H01L 51/56
See application file for complete search history.

(56) References Cited

U.S. PATENT DOCUMENTS

| | | | |
|---|---|---|---|
| 2015/0042903 A1* | 2/2015 | Misaki | G06F 3/044 349/12 |
| 2015/0049260 A1* | 2/2015 | Yashiro | G06F 3/044 349/12 |
| 2016/0109979 A1* | 4/2016 | Lee | G06F 3/044 345/174 |
| 2016/0299594 A1* | 10/2016 | Zhang | G06F 3/041 |
| 2016/0364072 A1 | 12/2016 | Chiang et al. | |
| 2017/0147116 A1* | 5/2017 | Lee | G06F 3/0412 |

FOREIGN PATENT DOCUMENTS

| | | |
|---|---|---|
| CN | 104238856 | 12/2014 |
| CN | 105528126 | 4/2016 |

\* cited by examiner

Providing a substrate and forming a touch layer on the substrate, and the touch layer comprises a light-shielding layer, a touch pattern layer, an insulating layer, a bridge layer, a peripheral line, and a bonding pad — S10

Forming a planarization layer on the touch layer, the planarization layer covering the touch pattern layer and the bridge layer — S20

Forming a color filter layer on the planarization layer to form a touch color filter substrate, and the color filter layer comprises a black matrix, a color resist, a protective layer, and a photoresist layer — S30

Encapsulating the touch color filter substrate, a thin film transistor substrate, and liquid crystals to form the touch display panel — S40

FIG. 1

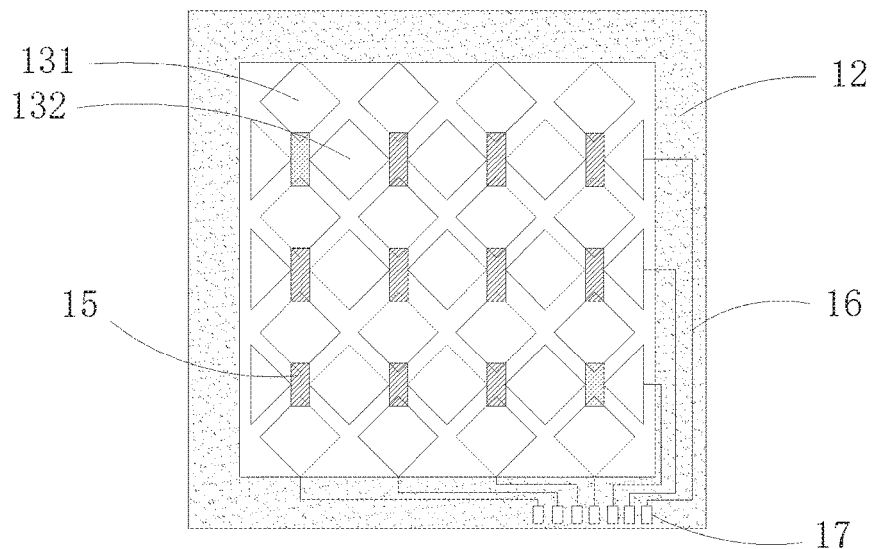

FIG. 2

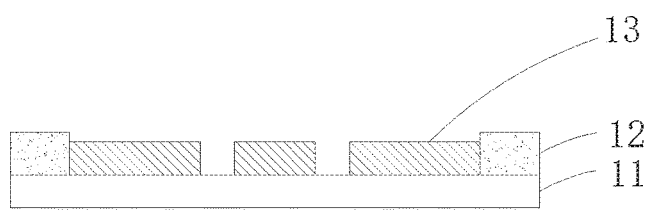

FIG. 3

TOUCH DISPLAY PANEL AND MANUFACTURING METHOD THEREOF

RELATED APPLICATIONS

This application is a National Phase of PCT Patent Application No. PCT/CN2018/099239 having International filing date of Aug. 7, 2018, which claims the benefit of priority of Chinese Patent Application No. 201810505239.2 filed on May 24, 2018. The contents of the above applications are all incorporated by reference as if fully set forth herein in their entirety.

FIELD AND BACKGROUND OF THE INVENTION

The present disclosure relates to the field of display technology, and more particularly to a touch display panel and a manufacturing method thereof.

As the development of the information age and life rhythm accelerates, touch technologies have gradually replaced traditional mouse and keyboards, and are widely used in various electronic products because of their properties of humanized design, easiness and quick to input, etc. Among the touch technologies, capacitive touch screens are widely used because of their advantages of high reaction speed, high sensitivity, high reliability, etc.

Touch display panels are divided into different structures such as add-on mode, in-cell mode, and on-cell mode by arrangement of touch sensing layers in display panels. The in-cell touch screens integrate touch functions into display screens, so that thickness of the whole displays can be effectively reduced and production process is simplified. Thus, products are lighter and thinner, and production costs are lower. For in-cell touch screens, in general, touch screen structures are directly disposed on array substrates in the prior art, which is mainly done by reusing some structural components used in transmitting display signals in the array substrate, to serve as touch electrodes. For example, data lines and scanning lines or public photoresist layers are reused as touch electrodes, and then these structural components are controlled to transmit display signals and touch signals in a time-division manner.

This type of in-cell touch screen structures is characterized in that in the structural aspect, the structural components which are used for transmitting display signals are reused as touch electrodes and leads to a high degree of integration for the structure components in the array substrates, and thus the manufacturing processes of the array substrates are extremely difficult. Moreover, it is difficult to control stability of the touch signals because of the high degree of integration in the structural components and the interference by the integrated touch structure on the display performance is more serious. In addition, in signal driving, driving chip requirements used for time-division driving is extremely harsh which greatly increases costs.

In conclusion, existing in-cell touch display panels present problems of unstable touch signals and the interferences of the touch structures on the display performance. Thus, the product yield of the display panels is not high.

TECHNICAL PROBLEMS

The present disclosure provides a manufacturing method of a touch display panel to solve the technical problems of the existing touch display panel that the touch signal is difficult to control, the display performance is seriously influenced because of interferences of the touch structures.

SUMMARY OF THE INVENTION

In order to solve the problem, the technical schemes provided by the present disclosure are as follows:

The present disclosure provides a manufacturing method of a touch display panel, comprising the steps of:

a step S10 of providing a substrate and forming a touch layer on the substrate, wherein the touch layer comprises a light-shielding layer, a touch pattern layer, an insulating layer, a bridge layer, a peripheral line, and a bonding pad;

a step S20 of forming a planarization layer on the touch layer, the planarization layer covering the touch pattern layer and the bridge layer;

a step S30 of forming a color filter layer on the planarization layer to form a touch color filter substrate, wherein the color filter layer comprises a black matrix, a color resist, a protective layer, and/or a photoresist layer; and a step S40 of encapsulating the touch color filter substrate, a thin film transistor substrate, and a display layer to form the touch display panel.

According to a preferred embodiment of the present disclosure, the bridge layer is made of indium tin oxide (ITO) or graphene; the peripheral line and the bonding pad are made of metal material.

According to a preferred embodiment of the present disclosure, the bridge layer, the peripheral line, and the bonding pad are made of a same metal material.

According to a preferred embodiment of the present disclosure, the bridge layer, the peripheral line, and the bonding pad are formed by one patterning process.

According to a preferred embodiment of the present disclosure, a width of the bridge layer is less than or equal to a width of the black matrix.

According to a preferred embodiment of the present disclosure, the touch pattern layer is made of ITO or graphene or the like having high transmittance.

According to a preferred embodiment of the present disclosure, the insulating layer is made of silicon nitride or organic insulation material.

According to a preferred embodiment of the present disclosure, the planarization layer is made of transparent organic material.

The present disclosure provides a touch display panel, comprising a thin film transistor substrate, a display layer, and a touch color filter substrate, wherein the touch color filter substrate comprises:

a substrate;

a touch layer disposed on the substrate, wherein the touch layer comprises a light-shielding layer, a touch pattern layer, an insulating layer, a bridge layer, a peripheral line, and a bonding pad;

a planarization layer disposed on the touch layer, wherein the planarization layer covers the touch pattern layer and the bridge layer; and a color filter layer disposed on the planarization layer, wherein the color filter layer comprises a black matrix, a color resist, a protective layer, and/or a photoresist layer.

According to a preferred embodiment of the present disclosure, the bridge layer is made of indium tin oxide (ITO) or graphene; the peripheral line and the bonding pad are made of metal material.

According to a preferred embodiment of the present disclosure, the bridge layer, the peripheral line, and the bonding pad are made of a same metal material.

According to a preferred embodiment of the present disclosure, the bridge layer, the peripheral line, and the bonding pad are formed by one patterning process.

According to a preferred embodiment of the present disclosure, a width of the bridge layer is less than or equal to a width of the black matrix.

According to a preferred embodiment of the present disclosure, the touch pattern layer is made of ITO or materials having high transmittance, such as graphene and the like.

According to a preferred embodiment of the present disclosure, the insulating layer is made of silicon nitride or organic insulation material.

According to a preferred embodiment of the present disclosure, the planarization layer is made of transparent organic material.

The beneficial effects of the present disclosure are that the touch display panel and the manufacturing method thereof are provided by firstly manufacturing a touch layer on a color filter substrate, so that the color film process and the touch process do not interfere with each other and touch display panel yield is increased. In addition, a bridge layer, a peripheral line, and a bonding pad are formed by one patterning process which simplified the manufacturing processes and reduce manufacturing costs.

BRIEF DESCRIPTION OF THE SEVERAL VIEWS OF THE DRAWINGS

In order to more clearly illustrate the technical solutions in the embodiments or in the prior art, the accompanying drawings required to be used in the description of the embodiments or the prior art are introduced briefly in the following, and apparently, the accompanying drawings in the following description are only some embodiments of the present invention, and persons of ordinary skill in the art will appreciate that, and other drawings can be obtained according to the accompanying drawings without creative efforts.

FIG. 1 is a flowchart of a manufacturing method of a touch display panel according to the first preferred embodiment of the present disclosure.

FIGS. 2, 3, 4, 5, 6, 7 and 8 are structural schematic diagrams of the touch display panel according to the first preferred embodiment of the present disclosure.

DESCRIPTION OF SPECIFIC EMBODIMENTS OF THE INVENTION

Figure 4:
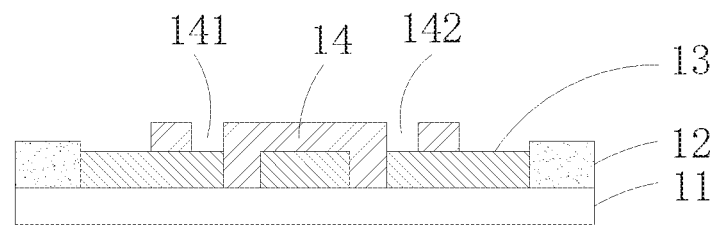

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

The present disclosure intends to solve the technical problems of the existing touch display panels that touch signal is difficult to control and the interferences of the touch structures on the display performance because the touch function is disposed on an array substrate and the touch signal and the transmission display signal share a portion of structure.

As shown in FIG. 1, FIG. 1 is a flowchart of a manufacturing method of a touch display panel according to the present preferred embodiment, comprising the steps of:

a step S10 of providing a substrate 11 and forming a touch layer on the substrate 11, wherein the touch layer comprises a light-shielding layer 12, a touch pattern layer 13, an insulating layer 14, a bridge layer 15, a peripheral line 16, and a bonding pad 17. As shown in FIG. 2, FIG. 2 is a structural schematic diagram of the touch display panel according to the present preferred embodiment after the step S10 is completed.

The step S10 specifically comprises the steps of:

a step S101 of forming the light-shielding layer 12 on an edge of a surface of the substrate 11.

A first film is first deposited on the surface of the substrate 11. The first film is then subjected to patterning processes such as exposing, developing, etching, and stripping processes to form the light-shielding layer 12 on the substrate 11. The light-shielding layer 12 is disposed around the edge of the substrate 11 and is configured to cover the peripheral line 16. The material of the first film is a black light-shielding material.

A step S102 of forming the touch pattern layer 13 on the surface of the substrate. The touch pattern layer 13 comprises a first touch electrode 131 and a second touch electrode 132.

As shown in FIG. 3, a second film is first deposited on the surface of the substrate 11. The second film is then subjected to patterning processes such as exposing, developing, etching, and stripping processes to form the touch pattern layer 13, namely the first touch electrode 131 and the second touch electrode 132. The light-shielding layer 12 is disposed around the touch pattern layer 13. Because the light-shielding layer is required to possess light transmission property, the second film is made of ITO. The second film can also be made of a material having high transmittance, such as graphene and the like.

A step S103 of forming the insulating layer 14 on the touch pattern layer 13.

As shown in FIG. 4, a third film is first deposited on a surface of the touch pattern layer. The third film is then subjected to patterning processes such as exposing, developing, etching, and stripping processes to form the insulating layer 14. A first contact hole 141 and a second contact hole 142 are formed in the insulating layer 14. The insulating layer 14 has certain requirements for light transmission. The third film is made of silicon nitride in order to form a transparent film. The third film can also be made of organic insulation materials.

A step S104 of forming the bridge layer 15 on the insulating layer 14.

A fourth film is first deposited on a surface of the insulating layer 14. The fourth film is then subjected to patterning processes such as exposing, developing, etching, and stripping processes to form the bridge layer 15. The bridge layer 15 is also required to possess light transmission property. The fourth film material is made of ITO. The fourth film material can also be made of materials having high transmittance, such as graphene and the like.

The bridge layer 15 is connected to the touch pattern layer 13 through the first contact hole 141 and the second contact hole 142. Each bridge layer 15 is connected to two first touch electrodes 131 in the same row and two second touch electrodes 132 in the same column. The bridge layer is disposed on alternate column of the second touch electrode 132. Please refer to FIG. 2 and FIG. 5 at the same time.

A step S105 of the peripheral line 16 and the bonding pad 17 are disposed on a surface of the light-shielding layer 12.

A metal layer is first deposited on the surface of the light-shielding layer 12. the metal layer is then subjected to patterning processes such as exposing, developing, etching, and stripping processes to form the peripheral line 16 and the bonding pad 17. The peripheral line 16 is configured to connect to the first touch electrode 131 in the same row and the peripheral line 16 is configured to connect to the second touch electrode 132 in the same column. Each bonding pad 17 is configured to connect to each peripheral line 16.

A step S20 of forming a planarization layer 18 on the touch layer and the planarization layer 18 covering the touch pattern layer 13 and the bridge layer 15.

Figure 6:
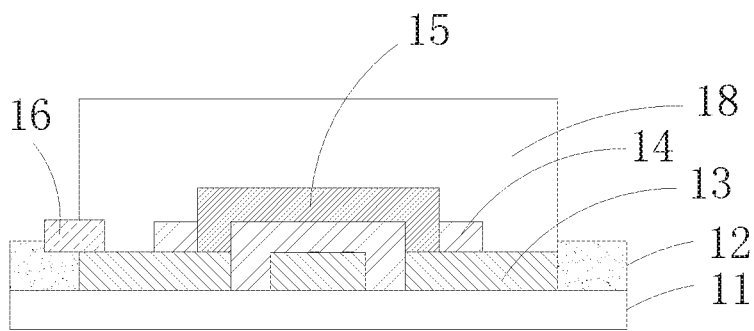

As shown in FIG. 6, a fifth film is first deposited on the bridge layer 15. The fifth film is then subjected to patterning processes such as exposing, developing, etching, and stripping processes to form the planarization layer 18. The planarization layer 18 is also required to possess light transmission property. The fifth film is made of a transparent organic material.

The planarization layer 18 covers the bridge layer 15 and the touch pattern layer 13. The planarization layer 18 is configured to protect the touch layer and provide a flat substrate for the color filter layer.

A step S30 of forming a color filter layer on the planarization layer 18 to form a touch color filter substrate, wherein the color filter layer comprises a black matrix 19, a color resist 20, a protective layer 21 and a photoresist layer 22.

Figure 7:
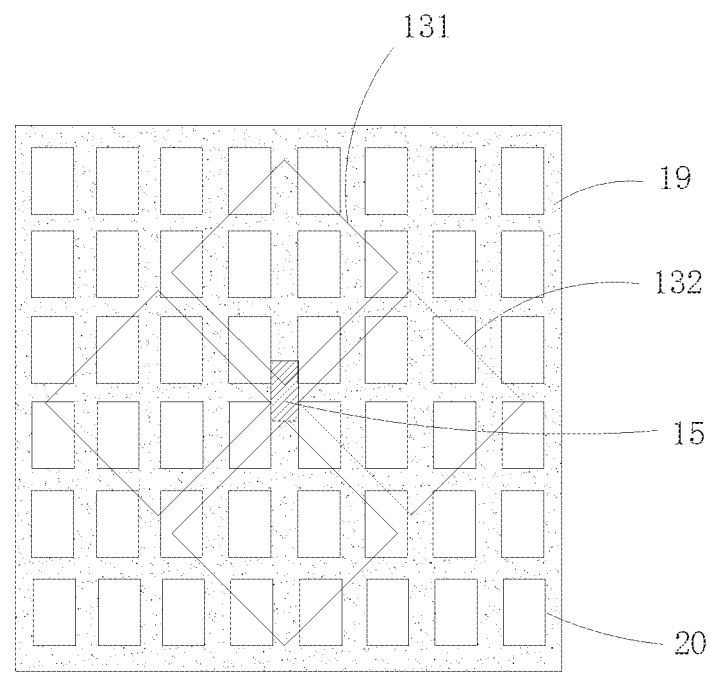

As shown in FIG. 7, FIG. 7 is a structural schematic diagram of positions of the touch layer and the color filter layer, shown with the color filter layer is positioned under the touch layer. In order to display the positional relationship between the touch layer and the color filter layer. The touch layer is illustrated as a visible layer.

The step S30 specifically comprises the steps of:

a step S301 of forming the black matrix 19 on a surface of the planarization layer 18.

A black matrix layer is first deposited on the surface of the planarization layer 18. The black matrix layer is then subjected to patterning processes such as exposing, developing, etching, and stripping processes to form the black matrix 19 on the surface of the planarization layer 18. The black matrix 19 is configured to cover an area between the adjacent pixels to prevent the occurrence of light leakage.

A step S302 of forming the color resist 20 on the surface of the planarization layer 18.

A color resist layer is first deposited on the surface of the planarization layer 18. The color resist layer is then subjected to patterning processes such as exposing, developing, etching, and stripping processes to form color resists 20 such as red color resist, green color resist, and blue color resist on the planarization layer 18. The color resist 20 is configured to convert white light into colored light in order to display a corresponding color image. The black matrix 19 is disposed between the adjacent color resists 20.

A step S303 of forming the protective layer 21 on the color resist 20.

The protective layer 21 is formed on the color resist 20. The protective layer 21 covers the black matrix 19 and the color resist 20.

A step S304 of forming the photoresist layer 22 on a surface of the protective layer 21.

Figure 8:
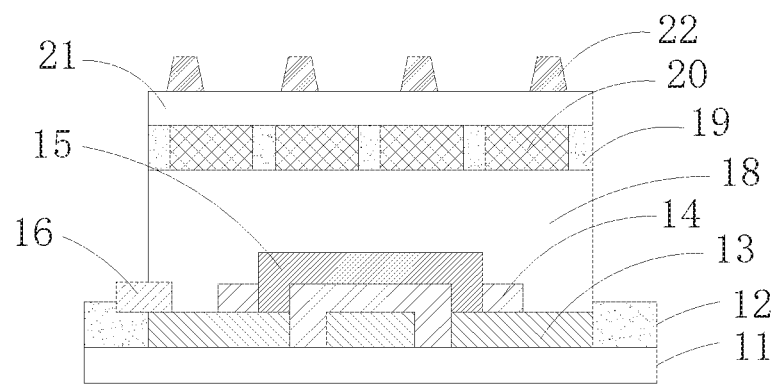

As shown in FIG. 8, the completion of the step S304 indicates the completion of the touch color filter substrate production.

a step S40 of encapsulating the touch color filter substrate, a thin film transistor substrate, and liquid crystals to form the touch display panel.

Specifically, the color filter substrate and the thin film transistor are subjected to assembling process in order to form a corresponding liquid crystal cell. The liquid crystal is injected into the liquid crystal box which indicates the completion of the manufacturing method for the touch display panel production according to the preferred embodiment.

Figure 9:
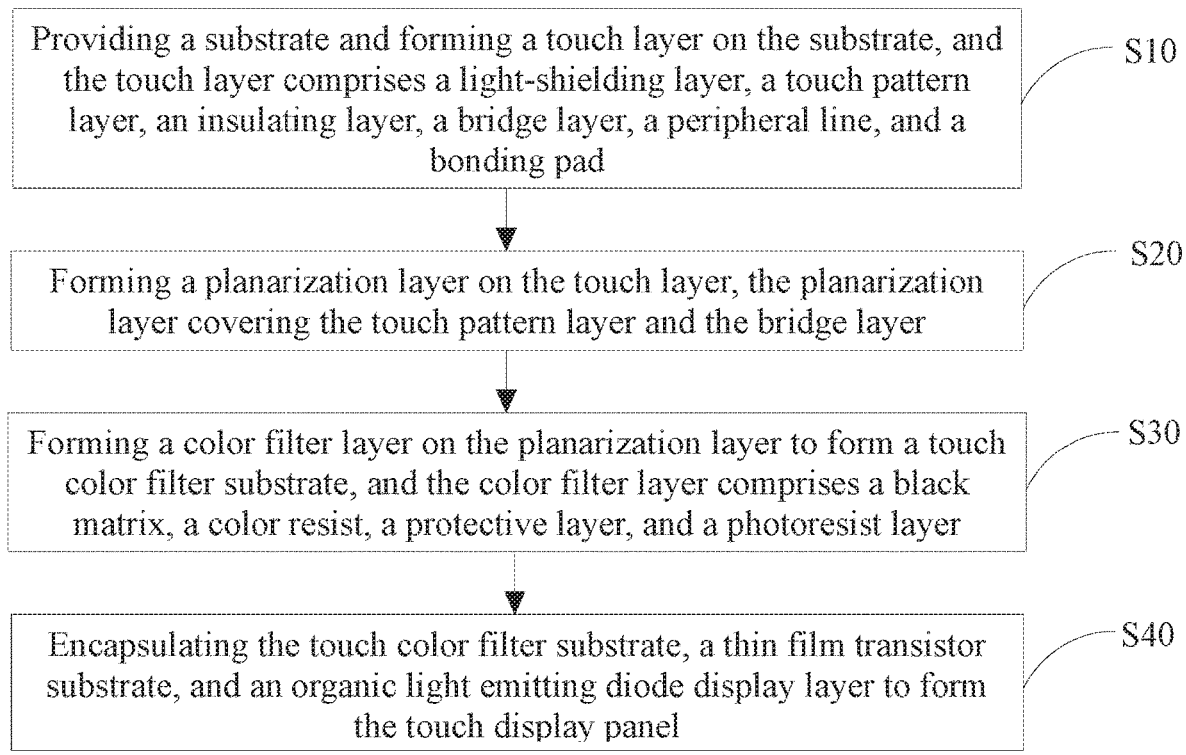
FIG. 9 is a flowchart of a manufacturing method of a touch display panel according to the second preferred embodiment of the present disclosure.

As shown in FIG. 9, FIG. 9 is a flowchart of a manufacturing method of a touch display panel according to the second preferred embodiment of the present disclosure. According to the preferred embodiment, the manufacturing method of the touch display panel comprises:

a step S10, providing a substrate 11, and forming a touch layer on the substrate 11, wherein the touch layer comprises a light-shielding layer 12, a touch pattern layer 13, an insulating layer 14, a bridge layer 15, a peripheral line 16, and a bonding pad 17.

The step S10 specifically comprises the steps of:

a step S101, forming a light-shielding layer 12 on the surface edge of the substrate 11.

A first film is first deposited on the surface of the substrate 11. The first film is then subjected to patterning processes such as exposing, developing, etching, and stripping processes to form the light-shielding layer 12 on the substrate 11. The light-shielding layer 12 is disposed around the edge of the substrate 11 and is configured to cover the peripheral line 16. The material of the first film is a black light-shielding material.

A step S102 of forming the touch pattern layer 13 on the surface of the substrate. The touch pattern layer 13 comprises a first touch electrode 131 and a second touch electrode 132.

Please refer to FIG. 2 of the above embodiment, a second film is first deposited on the surface of the substrate 11. The second film is then subjected to patterning processes such as exposing, developing, etching, and stripping processes to form the touch pattern layer 13, namely the first touch electrode 131 and the second touch electrode 132. The light-shielding layer 12 is disposed around the touch pattern layer 13. Because the light-shielding layer is required to possess light transmission property, the second film is made of ITO. The second film can also be made of a material having high transmittance, such as graphene and the like.

A step S103 of forming the insulating layer 14 on the touch pattern layer 13.

Referring to FIG. 4 of the above embodiment, a third film is first deposited on a surface of the touch pattern layer. The third film is then subjected to patterning processes such as exposing, developing, etching, and stripping processes to form the insulating layer 14. A first contact hole 141 and a second contact hole 142 are formed in the insulating layer 14. The insulating layer 14 has certain requirements for light transmission. The third film is made of silicon nitride in order to form a transparent film. The third film can also be made of organic insulation materials.

A step S104 of forming the bridge layer 15, the peripheral line 16, and the bonding pad 17 on the insulating layer.

Figure 5:
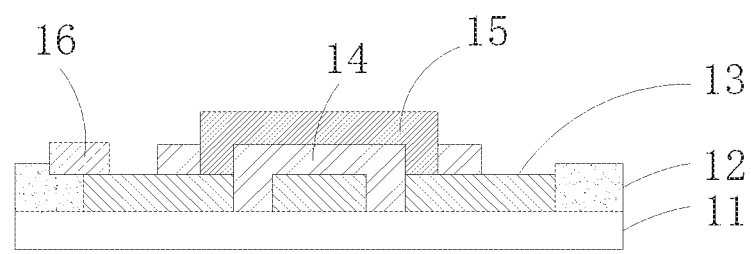

Please refer to FIG. 2 and FIG. 5 of the above embodiment, a fourth film is first deposited on a surface of the insulating layer. The fourth film is then subjected to patterning processes such as exposing, developing, etching, and stripping processes to form the bridge layer 15, the peripheral line 16, and the bonding pad 17. The fourth film material is made of a metal material.

The bridge layer 15 is connected to the touch pattern layer 13 through the first contact hole 141 and the second contact hole 142. Each bridge layer is connected to two first touch electrodes 131 in the same row and two second touch electrodes 132 in the same column. The bridge layer is disposed on alternate columns of the second touch electrode 132.

The peripheral line 16 is configured to connect to the first touch electrode 131 in the same row and the peripheral line 16 is configured to connect to the second touch electrode 132 in the same column. Each bonding pad 17 is configured to connect to each peripheral line 16.

A step S20 of forming a planarization layer 18 on the touch layer and the planarization layer 18 covering the touch pattern layer 13 and the bridge layer 15.

A fifth film is first deposited on the bridge layer 15. The fifth film is then subjected to patterning processes such as exposing, developing, etching, and stripping processes to form the planarization layer 18. The planarization layer 18 is also required to possess light transmission property. The fifth film is made of a transparent organic material.

The planarization layer 18 covers the bridge layer 15 and the touch pattern layer 13. The planarization layer 18 is configured to protect the touch layer and provide a flat substrate for the color filter layer.

A step S30 of forming a color filter layer on the planarization layer 18 to form a touch color filter substrate, wherein the color filter layer comprises a black matrix 19, a color resist 20, a protective layer 21 and a photoresist layer 22. Please refer to FIG. 7 of the above embodiment.

The step S30 specifically comprises the steps of:

a step S301 of forming the black matrix 19 on a surface of the planarization layer 18.

Figure 10:
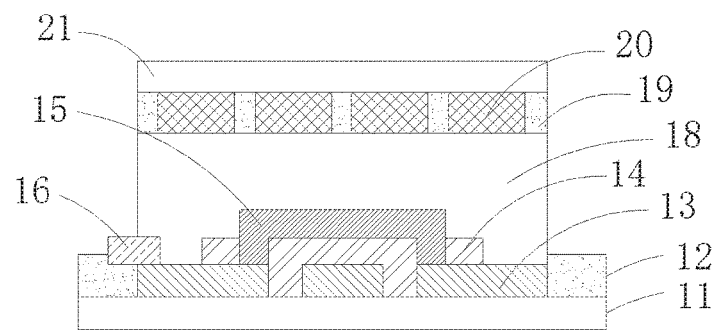
FIG. 10 is a structural schematic diagram of the touch display panel according to the second preferred embodiment of the present disclosure.

As shown in FIG. 10, a black matrix layer is first deposited on the surface of the planarization layer 18. The black matrix layer is then subjected to patterning processes such as exposing, developing, etching, and stripping processes to form the black matrix 19 on the surface of the planarization layer 18.

Because the bridge layer 15 is made of a metal which is opaque and reflective, the bridge layer 15 is positioned within the orthographic projection of the black matrix 19, i.e., a width of the black matrix 19 is greater than a width of the bridge layer 15. The black matrix 19 possesses a light absorption property which reduces the light which is reflected by the bridge layer 15. The black matrix 19 is also configured to cover an area between the adjacent pixels to prevent the occurrence of light leakage.

A step S302 of forming the color resist 20 on the surface of the planarization layer 18.

A color resist layer is first deposited on the surface of the planarization layer 18. The color resist layer is then subjected to patterning processes such as exposing, developing, etching, and stripping processes to form color resists 20 such as red color resist, green color resist, and blue color resist on the planarization layer 18. The color resist 20 is configured to convert white light into colored light in order to display a corresponding color image. The black matrix 19 is disposed between the adjacent color resists 20.

A step S303 of forming the protective layer 21 on the color resist 20.

The protective layer 21 is formed on the color resist 20. The protective layer 21 covers the black matrix 19 and the color resist 20.

The completion of the step S304 indicates the completion of the touch color filter substrate production.

A step S40 of encapsulating the touch color filter substrate, a thin film transistor substrate, and OLED display layer to form the touch display panel.

Please refer to FIG. 8 of the first embodiment, the present disclosure provides a touch display panel, comprising: a thin film transistor substrate, a liquid crystal layer, and a touch color filter substrate, wherein the touch color filter substrate comprises a substrate 11; a touch layer disposed on the substrate 11, the touch layer comprises a light-shielding layer 12, a touch pattern layer 13, and an insulating layer 14, a bridge layer 15, a peripheral line 16, and a bonding pad; a planarization layer 18 disposed on the touch layer, the planarization layer 18 covers the touch pattern layer 13 and the bridge layer 15; a color filter layer disposed on the planarization layer 18, and the color filter layer comprises a black matrix 19, a color resist 20, a protective layer 21 and a photoresist layer 22.

The bridge layer 15, the peripheral line 16, and the bonding pad are made of the same metal material. The bridge layer 15, the peripheral line 16, and the bonding pad are formed by one patterning process.

Please refer to FIG. 10 of the second embodiment. the present disclosure further provides a touch display panel, comprising: a thin film transistor substrate, an OLED display layer, a touch color filter substrate, wherein the touch color filter substrate comprises: a substrate 11; and a touch layer disposed on the substrate 11; wherein the touch layer comprises a light-shielding layer 12, a touch pattern layer 13, an insulating layer 14, a bridge layer 15, a peripheral line 16, and a bonding pad; a planarization layer 18 disposed on the touch layer and covers the touch pattern layer 13 and the bridge layer 15; and a color filter layer disposed on the planarization layer 18, wherein the color filter layer comprises a black matrix 19, a color resist 20, and a protective layer 21.

The bridge layer 15, the peripheral line 16, and the bonding pad are formed by one patterning process. The bridge layer 15, the peripheral line 16, and the bonding pad are made of a same metal material.

The beneficial effects are that the manufacturing method of the touch display panel provided by the present disclosure firstly manufacturing a touch layer on a color filter substrate, so that the color film process and the touch process do not interfere with each other and touch display panel yield is increased. In addition, a bridge layer, a peripheral line, and a bonding pad are formed by one patterning process which simplified the manufacturing processes and reduce manufacturing costs.

In summary, although the present invention has been described with preferred embodiments thereof, the above preferred embodiments is not used to limit the present invention. One of ordinarily skill in the art can carry out changes and modifications to the described embodiment without departing from the scope and the spirit of the invention that is intended to be limited only by the appended claims.

What is claimed is:

1. A touch display panel, comprising a thin film transistor substrate, a display layer, and a touch color filter substrate, wherein the touch color filter substrate comprises:

a substrate;

a touch layer disposed on the substrate, wherein the touch layer comprises a light-shielding layer, a touch pattern layer, an insulating layer, a bridge layer, a peripheral line, and a bonding pad, the touch pattern layer abuts the light-shielding layer, the bridge layer is disposed within an orthographic projection of the black matrix, the touch pattern layer comprises a first touch electrode and a second touch electrode, and each of the first touch electrode and the second touch electrode covers a plurality of meshes of the black matrix;

a planarization layer disposed on the touch layer, wherein the planarization layer covers the touch pattern layer and the bridge layer; and a color filter layer disposed on the planarization layer, wherein the color filter layer comprises a black matrix, a color resist, a protective layer, and/or a photoresist layer.

2. The touch display panel according to claim 1, wherein the bridge layer is made of indium tin oxide (ITO) or graphene; the peripheral line and the bonding pad are made of metal material.

3. The touch display panel according to claim 1, wherein the bridge layer, the peripheral line, and the bonding pad are made of a same metal material.

4. The touch display panel according to claim 3, wherein the bridge layer, the peripheral line, and the bonding pad are formed by one patterning process.

5. The touch display panel according to claim 4, wherein a width of the bridge layer is less than or equal to a width of the black matrix.

6. A manufacturing method of a touch display panel, comprising the steps of:

a step S10 of providing a substrate and forming a touch layer on the substrate, wherein the touch layer comprises a light-shielding layer, a touch pattern layer, an insulating layer, a bridge layer, a peripheral line, and a bonding pad, disposing the touch pattern layer to abut the light-shielding layer, disposing the bridge layer within an orthographic projection of the black matrix, wherein the touch pattern layer comprises a first touch electrode and a second touch electrode, and each of the first touch electrode and the second touch electrode covers a plurality of meshes of the black matrix;

a step S20 of forming a planarization layer on the touch layer, the planarization layer covering the touch pattern layer and the bridge layer;

a step S30 of forming a color filter layer on the planarization layer to form a touch color filter substrate, wherein the color filter layer comprises a black matrix, a color resist, a protective layer, and/or a photoresist layer; and a step S40 of encapsulating the touch color filter substrate, a thin film transistor substrate, and a display layer to form the touch display panel.

7. The manufacturing method according to claim 6, wherein the bridge layer is made of indium tin oxide (ITO) or graphene; the peripheral line and the bonding pad are made of metal material.

8. The manufacturing method according to claim 6, wherein the bridge layer, the peripheral line, and the bonding pad are made of a same metal material.

9. The manufacturing method according to claim 8, wherein the bridge layer, the peripheral line, and the bonding pad are formed by one patterning process.

10. The manufacturing method according to claim 9, wherein a width of the bridge layer is less than or equal to a width of the black matrix.

* * * * *

UNITED STATES PATENT AND TRADEMARK OFFICE
CERTIFICATE OF CORRECTION

PATENT NO. : 10,817,093 B2
APPLICATION NO. : 16/092446
DATED : October 27, 2020
INVENTOR(S) : Xiaoliang Feng Page 1 of 1

It is certified that error appears in the above-identified patent and that said Letters Patent is hereby corrected as shown below:

On the Title Page

Item (22) PCT Filed, "Jul. 7, 2018" should read -- Aug. 7, 2018 --

Item (30) Foreign Application Priority Data, "2018 1 0505239" should read -- 2018 1 0505239.2 --

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*